United States Patent [19]
Childs

[11] Patent Number: 5,510,741
[45] Date of Patent: Apr. 23, 1996

[54] RESET AND CLOCK CIRCUIT FOR PROVIDING VALID POWER UP RESET SIGNAL PRIOR TO DISTRIBUTION OF CLOCK SIGNAL

[75] Inventor: Matthew H. Childs, Arlington, Tex.

[73] Assignee: National Semiconductor Corporation, Santa Clara, Calif.

[21] Appl. No.: 521,213

[22] Filed: Aug. 30, 1995

[51] Int. Cl.[6] ............................................. H03K 3/02
[52] U.S. Cl. ............................................. 327/143; 327/198
[58] Field of Search .................................... 327/143, 198

[56] References Cited

U.S. PATENT DOCUMENTS

| | | | |
|---|---|---|---|
| 5,343,085 | 8/1994 | Fujimora | 327/143 |
| 5,446,403 | 8/1995 | Witkowski | 327/143 |

FOREIGN PATENT DOCUMENTS

| | | | |
|---|---|---|---|
| 2128831 | 5/1984 | United Kingdom | 327/143 |

OTHER PUBLICATIONS

IBM Tech. Disc. Bull. "Power–on–reset circuit sensitive to power supply level and clock" vol. 37 No. 02A Feb. 94 pp. 121–122.

*Primary Examiner*—Margaret Rose Wambach
*Attorney, Agent, or Firm*—Limbach & Limbach

[57] ABSTRACT

A reset and clock circuit for providing a valid power-up reset signal prior to distribution of a clock signal includes power sensing circuitry, a clock generator and a reset generator. The power sensing circuitry monitors the power supply voltage and generates a power-up signal which is asserted when it has risen above a predetermined value. The power sensing circuitry also receives a clock signal and, in accordance with the power-up and clock signals, provides a number of power status signals. One of the power status signals is asserted in response to assertion of the power-up signal, while another is asserted in response to reception of a group of clock signal pulses. The clock generator, in response to assertion of the first power status signal, provides the clock signal. The reset generator, in accordance with the power status signals and clock signal, provides a number of reset signals each one of which is initially asserted prior to the providing of the clock signal by the clock signal generator. One of the reset signals is de-asserted in response to reception of another group of clock signal pulses, while another is de-asserted in response to reception of still another group of clock signal pulses.

20 Claims, 3 Drawing Sheets

5,510,741

RESET AND CLOCK CIRCUIT FOR PROVIDING VALID POWER UP RESET SIGNAL PRIOR TO DISTRIBUTION OF CLOCK SIGNAL

BACKGROUND OF THE INVENTION

1. Field of the Invention

The present invention relates to reset signal generators used for resetting systems upon power-up, and in particular, to reset signal generators operating in cooperation with a clock signal generator for providing a valid reset signal to a system prior to the distribution of the clock signal.

2. Description of the Related Art

A problem common to virtually all digital logic systems is that of initializing such systems upon initial power-up. Absent an independent control or reset function, the state or states of the digital logic upon initial power-up will be unknown, thereby causing such circuitry to behave in an unpredictable manner. Such unpredictability is of particular concern when such circuitry is used for processing sensitive data. Such data can become corrupted or otherwise lost due to this unpredictability.

Conventional solutions have included assertion of a system reset as soon as possible after the system clock signal becomes active. However, this results in a time interval during which volatile memory can be corrupted and/or sensitive data can be lost or transmitted in an undesired manner. Accordingly, it would be desirable to have a technique for resetting the system upon initial power-up so as to place the logic in a known state prior to application of the system clock signal.

SUMMARY OF THE INVENTION

A reset and clock circuit in accordance with the present invention provides a valid power-up reset signal prior to distribution of a clock signal so as to place the host system in a known state, thereby advantageously preventing corruption or loss of sensitive data which would otherwise occur due to the system being in an unknown state. Another reset and clock circuit in accordance with the present invention further maintains distribution of the clock signal for a predetermined time interval following a predetermined decrease in the power supply voltage.

A reset and clock circuit for providing a valid power-up reset signal prior to distribution of a clock signal in accordance with one embodiment of the present invention includes a power detector, a power status indicator, a clock signal generator and a reset signal generator. The power detector is for receiving a power supply voltage and providing a first power-up signal which is asserted when the power supply voltage exceeds a first predetermined value. The power status indicator is coupled to the power detector and is for receiving the first power-up signal and a clock signal and in accordance therewith providing a number of power status signals. The clock signal includes a number of clock pulses, one of the power status signals is asserted in response to assertion of the first power-up signal and another one of the power status signals is asserted in response to reception of a portion of the clock pulses. The clock signal generator is coupled to the power status indicator and is for receiving the first one of the power status signals and in response to the assertion thereof providing the clock signal. The reset signal generator is coupled to the power status indicator and the clock signal generator and is for receiving the plurality of power status signals and the clock signal and in accordance therewith providing a number of reset signals. Each one of the reset signals is initially asserted prior to the providing of the clock signal by the clock signal generator. One of the reset signals is de-asserted in response to reception of another portion of the clock pulses and another one of the reset signals is de-asserted in response to a reception of a third portion of the clock pulses.

A reset and clock circuit in accordance with another embodiment of the present invention is further for maintaining distribution of the clock signal for a predetermined time interval following a predetermined decrease in the power supply voltage. The power status indicator receives a second power-up signal which is de-asserted when the power supply voltage decreases below a second predetermined value. The providing of the clock signal by the clock signal generator is terminated after the predetermined time interval following the decrease in the power supply voltage below the second predetermined value.

These and other features and advantages of the present invention will be understood upon consideration of the following detailed description of the invention and the accompanying drawings.

DETAILED DESCRIPTION OF THE INVENTION

Figure 1:
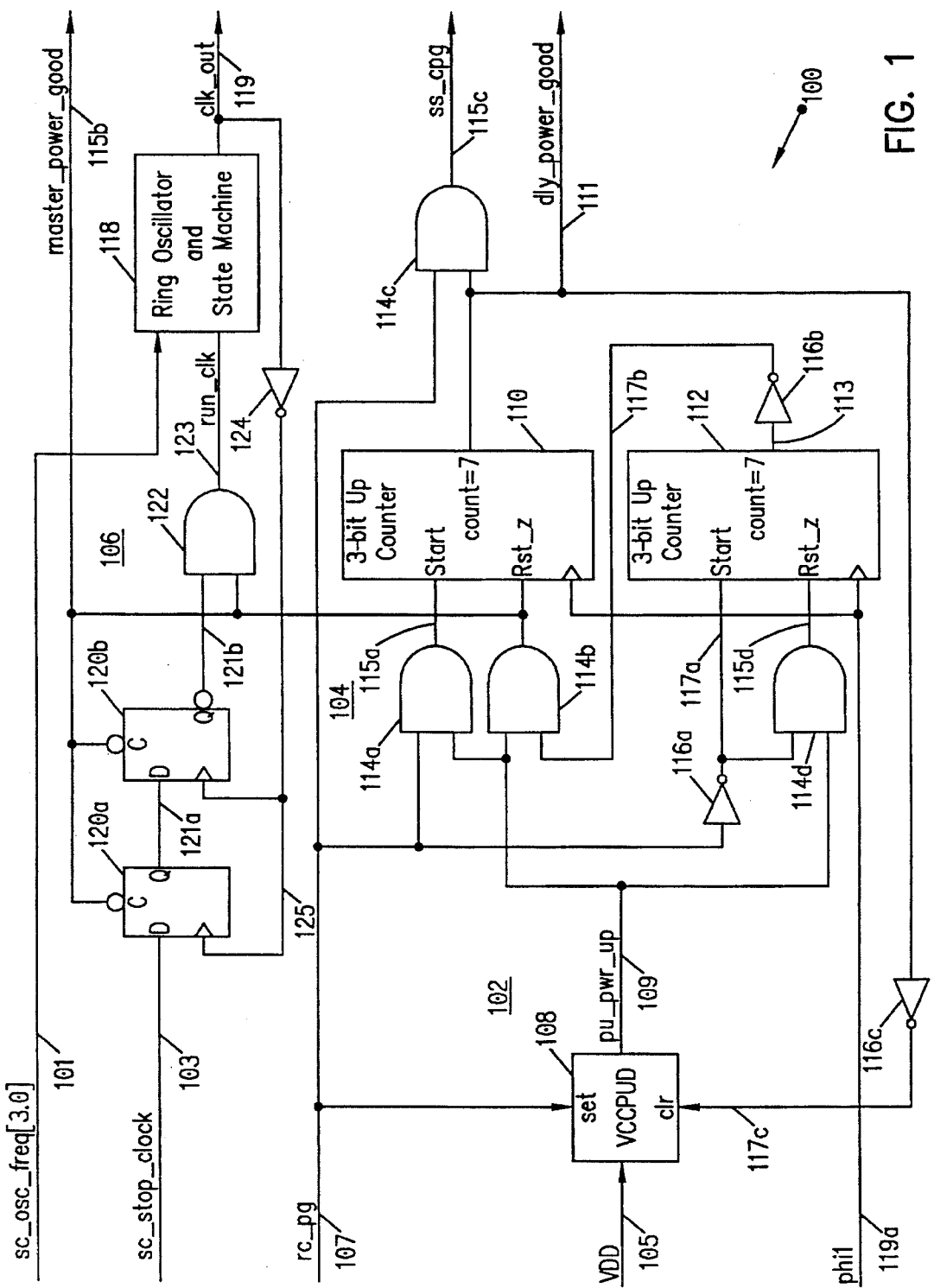
FIG. 1 is a functional logic diagram of the power detector, power status indicator and clock signal generator portions of a reset and clock circuit in accordance with one embodiment of the present invention.

Referring to FIG. 1, the power detection and clock generator section 100 of a reset and clock circuit in accordance with one embodiment of the present invention includes a power detector 102, a power status indicator 104 and a clock signal generator 106. As discussed in more detail below: the power detector 102 includes a presettable and clearable power detector circuit 108; the power status indicator 104 includes two 3-bit up counters 110, 112, four logic AND gates 114 and two logic inverters 116, interconnected substantially as shown; and the clock signal generator 106 includes a ring oscillator and state machine 118, two D-type flip-flops 120, a logic AND gate 122 and a logic inverter 124, all interconnected substantially as shown.

The power detector 102 and power status indicator 104 both receive an input power status signal 107 which is asserted when the system power supply voltage is above a predetermined value. Also received is the primary phase 119a of the system clock signal 119 which is generated by the ring oscillator and state machine 118 (discussed in more detail below).

The power detector circuit 108 (e.g. a voltage comparator with analog inputs and a binary output) monitors the power supply voltage 105 and provides a binary output signal 109 which is set to a logic 1 when the power supply voltage 105 exceeds a predetermined value, or alternatively, when the input power status signal 107 is in a logic 0 state for seven cycles of the primary clock signal phase 119a (which is indicative of an impending power-down of the system). The output 109 can be preset or cleared in accordance with the input set 107 and clear 117c signals, respectively. The set input 107 is the input power status signal 107, while the clear input 117c is the inverse of the delayed power good signal 111 (discussed in more detail below), with the set signal 107 taking precedence over the clear signal 117c.

The power-up signal 109 and input power status signal 107 are logically processed, along with the inverted output signal 117b from the second counter 112, by two logic AND gates 114a, 114b to provide the start 115a and reset 115b control signals for the first counter 110. The reset control signal 115b is also used as a master power good signal for indicating the status of the power supply voltage 105. In accordance with these two input signals 115a, 115b, the first counter 110, acting as a power-up counter, begins counting the pulses of the primary clock signal phase 119a. After seven pulses have been counted, its output 111, acting as a delayed power good status signal, is asserted. When the input power status signal 107 is also asserted, a chip power good signal 115c, formed by logically ANDing the input 107 and output 111 power status signals, is also asserted. (The delayed power good signal 111 is also inverted by an inverter 116c to provide the clear signal 117c for the power detector 108.)

The power-up signal 109 is also logically ANDed with the inverse 117a of the input power status signal 107 to produce a reset control signal 115d for the second counter 112, with the inverse 117a of the input power status signal 107 serving as the start control signal. When the power supply voltage 105 drops below a predetermined value, the input power status signal 107 is de-asserted. Accordingly, the chip power good signal 115c is also de-asserted and the second counter 112, acting as a power-down counter, begins counting the pulses of the primary clock signal phase 119a. Once seven pulses have been counted, the output 113 of the second counter 112 is asserted, resulting in its inverse 117b disabling the output of the AND gate 114b, thereby causing the master power good signal 115b to be de-asserted. In turn, due to the logical ANDing operation of the AND gate 122 in the clock signal generator 106, the control signal 123 for the ring oscillator and state machine 118 is de-asserted, thereby disabling the clock signal 119.

The ring oscillator and state machine 118 is programmable to provide the output clock signal 119 at any of sixteen different frequencies, based upon a 4-bit input programming signal 101. The inverse 125 of the clock signal 119 is used to clock the flip-flops 120 which receive an auxiliary clock control signal 103 for selectively disabling operation of the ring oscillator and state machine 118.

Figure 2:
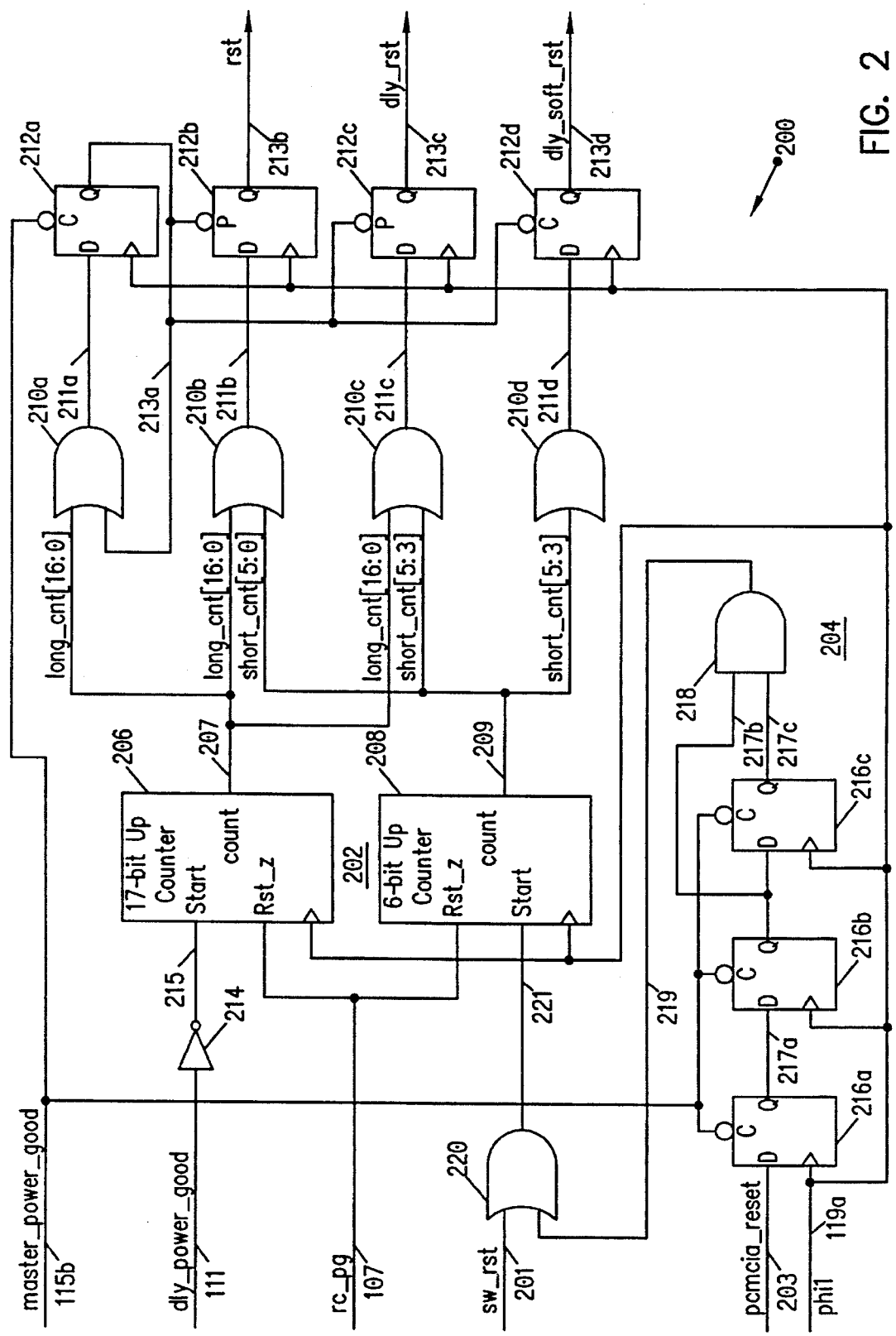
FIG. 2 is a functional logic diagram of a reset signal generator portion of a reset and clock circuit in accordance with one embodiment of the present invention.

Referring to FIG. 2, the reset portion 200 of a reset and clock circuit in accordance with one embodiment of the present invention includes a reset signal generator 202 and an external reset processor 204. The reset signal generator 202 includes a 17-bit counter 206, a 6-bit counter 208, four logic OR gates 210, four D-type flip-flops 212 and a logic inverter 214, all interconnected substantially as shown. The external reset processor 204 includes three D-type flip-flops 216, a logic AND gate 218 and a logic OR gate 220, all interconnected substantially as shown.

The external reset processor 204 receives an external reset signal 203 which is successively clocked through the flip-flops 216 in accordance with the primary clock signal phase 119a. The second 217b and third 217c latched reset signals are logically ANDed, with the result being logically ORed with an auxiliary external reset signal 201, with that result, in turn, being used as the start control signal 221 for the 6-bit counter 208.

The input power status signal 107 also serves as the reset control signal for both counters 206, 208 in the reset signal generator 202. The inverse 215 of the delayed power good signal 111 serves as a start control signal for the 17-bit counter 206. All 17 bits of the output 207 of the first counter 206 are provided as inputs to the first three OR gates 210a, 210b, 210c. All six bits of the output 209 from the second counter 208 are provided as inputs to the second OR gate 210b, while the three most significant bits are provided as inputs to the last two OR gates 210c, 210d. The outputs 211a, 221b, 211c, 211d of the OR gates 210a, 210b, 210c, 210d are provided as the data inputs to their corresponding flip-flops 212a, 212b, 212c, 212d which are clocked by the primary clock signal phase 119a. The clear input of the first flip-flop 212a is controlled by the master power good signal 115b. The Q-output of the first flip-flop 212a controls the preset inputs of the second and third flip-flops 212b, 212c and the clear input of the last flip-flop 212d.

Based upon its input signals, i.e. the master power good signal 115b, the delayed power good signal 111, the input power status signal 107 and the processed external reset signal 221 (the last being based, in turn, upon the two external reset signals 201, 203), the reset signal generator 202 generates the system reset signal 213b. This reset signal 213b is asserted for a minimum of 131,071 clock pulses upon power-up and for 63 clock pulses upon an external reset (per either the first 201 or second 203 external reset signal). The two counters 206, 208 generate the various reset signal pulse widths necessary under the various reset conditions. For example, upon power-up the system reset signal 213b is asserted before the system clock signal 119 becomes active. Once the system clock 119 becomes active, the 17-bit counter 206 holds the reset signal 213b active for 131,071 clock pulses. Upon the occurrence of an external reset (per either of the external reset signals 201, 203), the 6-bit counter 208 holds the reset signal 213b active for 63 clock pulses. Upon the occurrence of a power-down condition, the reset signal 213b is asserted seven clocks after the trailing edge of the input power status signal 107.

The reset signal generator 202 provides two additional reset signals 213c, 213d that can be used to ensure that a minimum of seven clock signal 119 pulses occur after a reset condition without a period of having the system disabled. Assertion of the first additional reset signal 213c occurs upon assertion of either of the two external reset signals 201, 203. This reset signal 213c is not asserted until seven clocks after the primary reset signal 213b has been asserted, and de-asserts along with the primary reset signal 213b.

The second additional reset signal 213d is similar to the primary reset signal 213b except upon the assertion of either of the two external reset signals 201, 203. This second additional reset signal 213d is not asserted until seven clocks after the primary reset signal 213b has been asserted.

Figure 3:
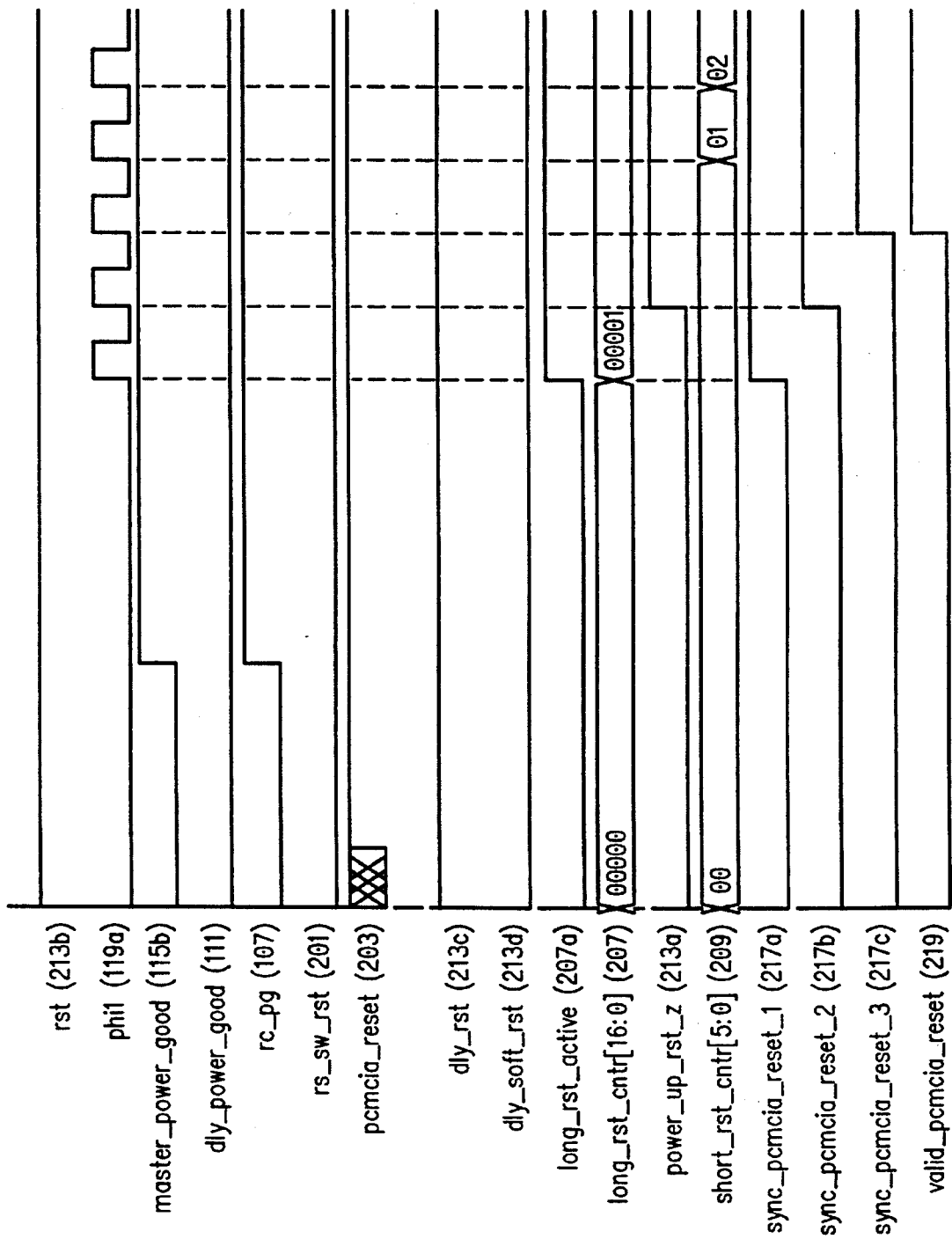
FIG. 3 is a timing diagram for the signals of FIGS. 1 and 2.

Referring to FIG. 3, the timing relationships among the aforementioned signals in FIGS. 1 and 2 are illustrated for a better understanding thereof. For purposes of the timing relationships as illustrated, it is assumed that the power supply voltage 105 is above the minimum operating threshold. In accordance with the foregoing discussion, once the input power status signal 107 is asserted, the master power good signal 115b is asserted and thereby enables the ring oscillator and state machine 118 which, in turn, begins providing the system clock signal 119. Once the system clock signal 119 is initiated, the reset counters 206, 208 begin counting. Throughout all of this, the primary reset signal 213b is already asserted. (A signal identified as "long_rst_active (207a)" is included; this signal 207a is simply the result of a logically ORing of the 17 bits of the output signal 207 of the first counter 206.)

In accordance with the foregoing discussion, the master power good signal 115b indicates when the system power supply voltage is at an operable level for the system, and the primary reset signal 213b is asserted while the master power good signal 115b is at a logic 0. Once the master power good signal 115b is asserted, the clock output 119 is enabled.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a reset and clock circuit for providing a valid power-up reset signal prior to distribution of a clock signal, said reset and clock circuit comprising:

a power detector for receiving a power supply voltage and providing a first power-up signal which is asserted when said power supply voltage exceeds a first predetermined value;

a power status indicator, coupled to said power detector, for receiving said first power-up signal and a clock signal and in accordance therewith providing a plurality of power status signals, wherein said clock signal includes a plurality of clock pulses, a first one of said plurality of power status signals is asserted in response to said assertion of said first power-up signal and a second one of said plurality of power status signals is asserted in response to a reception of a first portion of said plurality of clock pulses;

a clock signal generator, coupled to said power status indicator, for receiving said first one of said plurality of power status signals and in response to said assertion thereof providing said clock signal; and a reset signal generator, coupled to said power status indicator and said clock signal generator, for receiving said plurality of power status signals and said clock signal and in accordance therewith providing a plurality of reset signals, wherein each one of said plurality of reset signals is initially asserted prior to said providing of said clock signal by said clock signal generator, a first one of said plurality of reset signals is de-asserted in response to a reception of a second portion of said plurality of clock pulses and a second one of said plurality of reset signals is de-asserted in response to a reception of a third portion of said plurality of clock pulses.

2. The apparatus of claim 1, wherein said power detector comprises an analog input voltage comparator with a presettable binary output.

3. The apparatus of claim 1, wherein said power status indicator comprises a binary counter.

4. The apparatus of claim 1, wherein said clock signal generator comprises a ring oscillator.

5. The apparatus of claim 1, wherein said reset signal generator comprises a binary counter, a plurality of binary logic circuits and a plurality of binary registers.

6. The apparatus of claim 1, wherein said reset and clock circuit is further for maintaining distribution of said clock signal for a predetermined time interval following a predetermined decrease in said power supply voltage, and wherein said power status indicator receives a second power-up signal which is de-asserted when said power supply voltage decreases below a second predetermined value and said providing of said clock signal by said clock signal generator is terminated after said predetermined time interval following said decrease in said power supply voltage below said second predetermined value.

7. The apparatus of claim 6, wherein said power detector comprises an analog input voltage comparator with a presettable binary output.

8. The apparatus of claim 6, wherein said power status indicator comprises a plurality of binary counters.

9. The apparatus of claim 6, wherein said clock signal generator comprises a ring oscillator.

10. The apparatus of claim 6, wherein said reset signal generator comprises a binary counter, a plurality of binary logic circuits and a plurality of binary registers.

11. A method of providing a valid power-up reset signal prior to distribution of a clock signal, said method comprising the steps of:

receiving a power supply voltage;

asserting a first power-up signal when said power supply voltage exceeds a first predetermined value;

receiving a clock signal which includes a plurality of clock pulses;

generating a plurality of power status signals in accordance with said first power-up signal and said clock signal, wherein a first one of said plurality of power status signals is asserted in response to said assertion of said first power-up signal and a second one of said plurality of power status signals is asserted in response to a reception of a first portion of said plurality of clock pulses;

generating said clock signal in response to said assertion of said first one of said plurality of power status signals; and generating a plurality of reset signals in accordance with said plurality of power status signals and said clock signal, wherein each one of said plurality of reset signals is initially asserted prior to said generating of said clock signal, a first one of said plurality of reset signals is de-asserted in response to a reception of a second portion of said plurality of clock pulses and a second one of said plurality of reset signals is de-asserted in response to a reception of a third portion of said plurality of clock pulses.

12. The method of claim 11, wherein said step of asserting a first power-up signal when said power supply voltage exceeds a first predetermined value comprises comparing said power supply voltage with a reference voltage and in accordance therewith generating a binary output signal as said first power-up signal.

13. The method of claim 11, wherein said step of generating a plurality of power status signals in accordance with said first power-up signal and said clock signal comprises controlling a binary counter with said first power-up signal and said clock signal.

14. The method of claim 11, wherein said step of generating said clock signal in response to said assertion of said first one of said plurality of power status signals comprises controlling a ring oscillator with said first one of said plurality of power status signals.

15. The method of claim 11, wherein said step of generating a plurality of reset signals in accordance with said plurality of power status signals and said clock signal comprises controlling a binary counter with said plurality of power status signals and said clock signal and processing a binary output therefrom with a plurality of binary logic circuits and a plurality of binary registers.

16. The method of claim 11, wherein said method is further for maintaining distribution of said clock signal for a predetermined time interval following a predetermined decrease in said power supply voltage, and wherein said method further comprises the steps of:

receiving a second power-up signal which is de-asserted when said power supply voltage decreases below a second predetermined value; and terminating said generating of said clock signal after said predetermined time interval following said decrease in said power supply voltage below said second predetermined value.

17. The method of claim 16, wherein said step of asserting a first power-up signal when said power supply voltage exceeds a first predetermined value comprises comparing said power supply voltage with a reference voltage and in accordance therewith generating a binary output signal as said first power-up signal.

18. The method of claim 16, wherein said step of generating a plurality of power status signals in accordance with said first power-up signal and said clock signal comprises controlling a plurality of binary counters with said first power-up signal and said clock signal.

19. The method of claim 16, wherein said step of generating said clock signal in response to said assertion of said first one of said plurality of power status signals comprises controlling a ring oscillator with said first one of said plurality of power status signals.

20. The method of claim 16, wherein said step of generating a plurality of reset signals in accordance with said plurality of power status signals and said clock signal comprises controlling a binary counter with said plurality of power status signals and said clock signal and processing a binary output therefrom with a plurality of binary logic circuits and a plurality of binary registers.

\* \* \* \* \*